United States Patent
Okabe et al.

(10) Patent No.: US 10,777,633 B2
(45) Date of Patent: Sep. 15, 2020

(54) DISPLAY DEVICE, DISPLAY DEVICE MANUFACTURING METHOD, AND DISPLAY DEVICE MANUFACTURING APPARATUS

(71) Applicant: Sharp Kabushiki Kaisha, Sakai, Osaka (JP)

(72) Inventors: Tohru Okabe, Sakai (JP); Ryosuke Gunji, Sakai (JP); Shinsuke Saida, Sakai (JP); Shinji Ichikawa, Sakai (JP); Hiroki Taniyama, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/472,222

(22) PCT Filed: Sep. 29, 2017

(86) PCT No.: PCT/JP2017/035730
§ 371 (c)(1),
(2) Date: Jun. 21, 2019

(87) PCT Pub. No.: WO2019/064592
PCT Pub. Date: Apr. 4, 2019

(65) Prior Publication Data
US 2020/0091269 A1    Mar. 19, 2020

(51) Int. Cl.
*H01L 27/32*    (2006.01)
*H01L 51/56*    (2006.01)
(Continued)

(52) U.S. Cl.
CPC ........ *H01L 27/3276* (2013.01); *G02F 1/1343* (2013.01); *H01L 27/3248* (2013.01);
(Continued)

(58) Field of Classification Search
CPC .............. H01L 27/124; H01L 27/3276; H01L 27/3279; H01L 51/56; G02F 1/1343
See application file for complete search history.

(56) References Cited

U.S. PATENT DOCUMENTS 7,462,516 B2 * 12/2008 Ahn ................. H01L 27/14621
257/E27.111
2001/0007491 A1 * 7/2001 Maeda ................. G02F 1/1345
349/143
(Continued)

FOREIGN PATENT DOCUMENTS

JP    2003-107523 A    4/2003
JP    2004-191972 A    7/2004
(Continued)

OTHER PUBLICATIONS

Official Communication issued in International Patent Application No. PCT/JP2017/035730, dated Dec. 26, 2017.

*Primary Examiner* — Matthew E Warren
(74) *Attorney, Agent, or Firm* — Keating & Bennett, LLP

(57) ABSTRACT

A display device includes a TFT layer provided with a terminal configured to receive a signal inputted from an external source, and a terminal wiring line in a lower layer underlying the terminal, and a light emitting element layer in an upper layer overlying the TFT layer. The terminal includes a main portion and a peripheral portion surrounding the main portion. The peripheral portion is covered by a cover film, the terminal wiring line and a lower face of the peripheral portion are in contact, and the main portion and the terminal wiring line overlap via at least one terminal base film.

17 Claims, 18 Drawing Sheets

(51) Int. Cl.
    *G02F 1/1343*     (2006.01)
    *H01L 27/12*     (2006.01)
    *H01L 51/00*     (2006.01)
    *H01L 51/52*     (2006.01)

(52) U.S. Cl.
    CPC ........ *H01L 27/3279* (2013.01); *H01L 51/003* (2013.01); *H01L 51/5253* (2013.01); *H01L 51/56* (2013.01); *H01L 27/124* (2013.01); *H01L 2227/323* (2013.01); *H01L 2227/326* (2013.01)

(56) References Cited

U.S. PATENT DOCUMENTS

| | | | |
|---|---|---|---|
| 2003/0063229 A1* | 4/2003 | Takahashi | G02F 1/136286 349/43 |
| 2004/0109102 A1 | 6/2004 | Chang et al. | |
| 2006/0146213 A1 | 7/2006 | Ahn et al. | |
| 2008/0116579 A1 | 5/2008 | Araumi | |
| 2016/0190055 A1 | 6/2016 | Jinbo et al. | |
| 2018/0191880 A1* | 7/2018 | Nagasawa | H01L 27/124 |

FOREIGN PATENT DOCUMENTS

| | | |
|---|---|---|
| JP | 2006-189768 A | 7/2006 |
| JP | 2008-147614 A | 6/2008 |
| JP | 2009-069251 A | 4/2009 |
| JP | 2016-127018 A | 7/2016 |
| JP | 2017-096998 A | 6/2017 |

\* cited by examiner

DISPLAY DEVICE, DISPLAY DEVICE MANUFACTURING METHOD, AND DISPLAY DEVICE MANUFACTURING APPARATUS

TECHNICAL FIELD

The disclosure relates to a display device.

BACKGROUND ART

In PTL 1, there is disclosed a display panel including an organic electroluminescent (EL) element in which an interlayer insulating film is configured to cover an edge of a terminal.

CITATION LIST

Patent Literature

PTL 1: JP 2009-69251 A (published on Apr. 2, 2009)

SUMMARY

Technical Problem

In the configuration of the related art, the possibility exists that a significant step will occur between a terminal upper face (exposed portion) and an upper face of the interlayer insulating film covering the edge of the terminal, causing a poor connection between the terminal and an external circuit substrate when the external circuit substrate is mounted.

Solution to Problem

A display device according to an aspect of the disclosure includes a TFT layer provided with a terminal and a terminal wiring line in a lower layer underlying the terminal, and a light emitting element layer in an upper layer overlying the TFT layer. The terminal includes a main portion and a peripheral portion surrounding the main portion. The peripheral portion is covered by a cover film, the terminal wiring line and a lower face of the peripheral portion are in contact, and the main portion and the terminal wiring line overlap via at least one terminal base film.

Advantageous Effects of Disclosure

According to the aspect of the disclosure, a step between the upper face of the cover film covering the peripheral portion of the terminal and the upper face (exposed face) of the main portion is minimized, making the occurrence of a poor connection between an external circuit substrate and the terminal when the external circuit substrate is mounted less likely.

DESCRIPTION OF EMBODIMENTS

Figure 1:
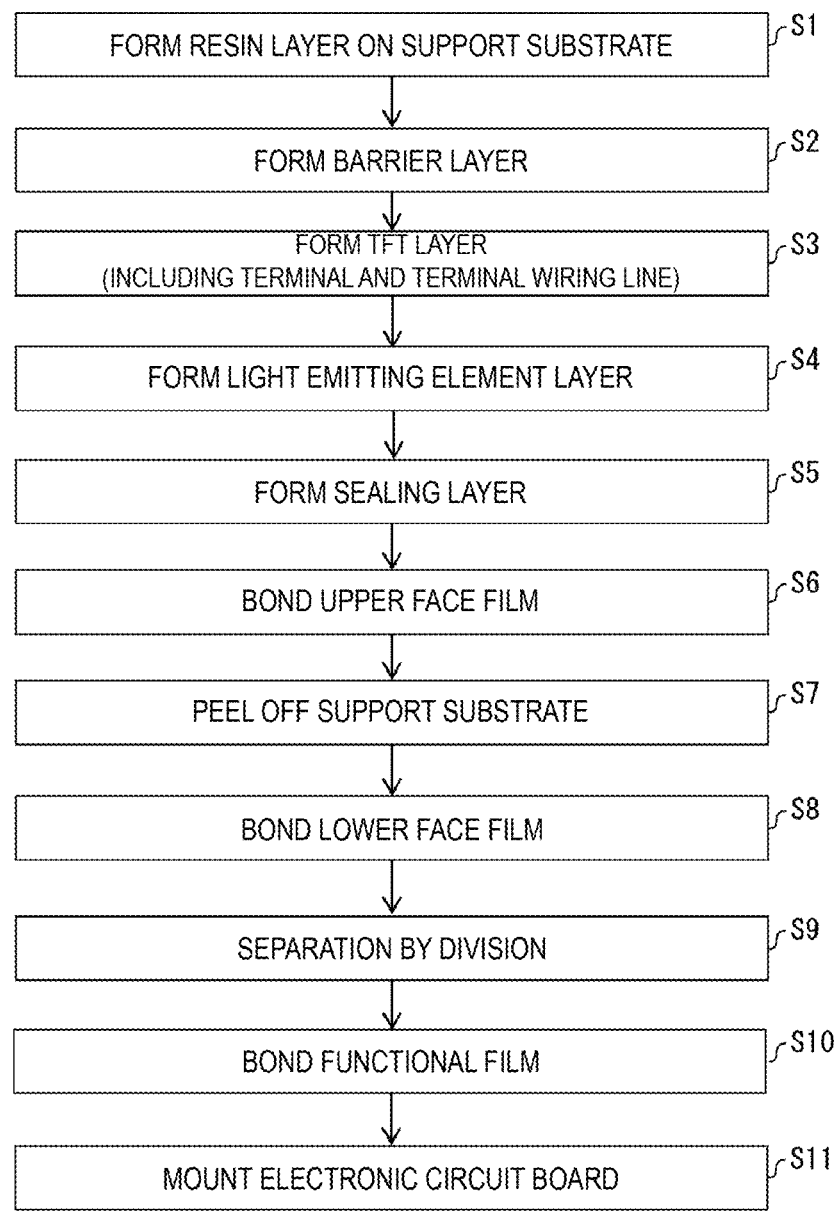
FIG. 1 is a flowchart illustrating an example of a manufacturing method of a display device.
Figure 2:
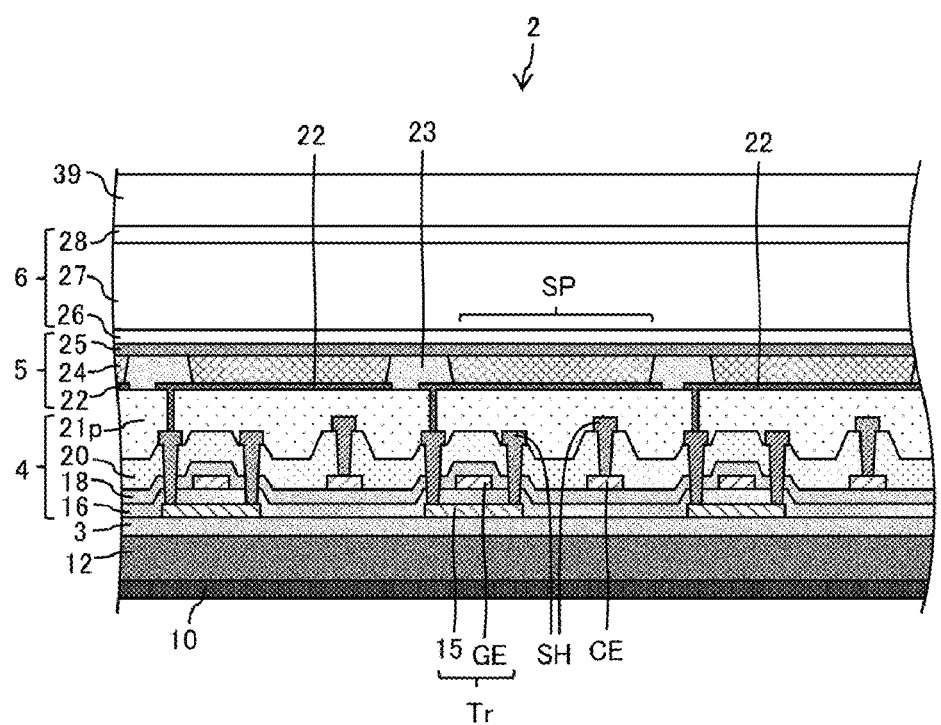
FIG. 2 is a cross-sectional view illustrating a configuration example of a display portion of the display device.
Figure 3:
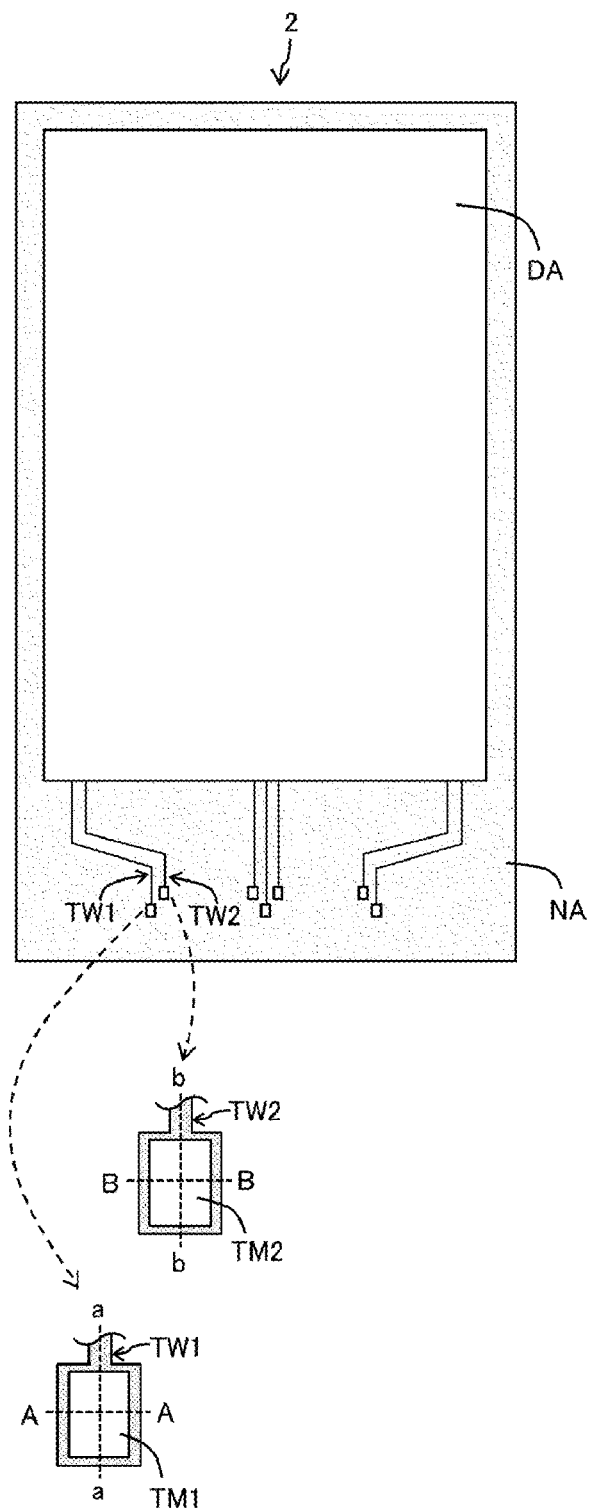
FIG. 3 is a plan view illustrating a configuration example of the display device of a first embodiment.

FIG. 1 is a flowchart illustrating an example of a manufacturing method of a display device. FIG. 2 is a cross-sectional view illustrating a configuration example of a display portion of the display device. FIG. 3 is a plan view illustrating a configuration example of the display device of a first embodiment. In the following, a "same layer" refers to a layer formed in the same process using the same material, a "lower layer" refers to a layer formed in a process before the layer being compared, and an "upper layer" refers to a layer formed in a process after the layer being compared.

When the flexible display device is manufactured, as illustrated in FIG. 1 to FIG. 3, first, a resin layer 12 is formed on a transparent support substrate (a mother glass substrate, for example) (step S1). Next, a barrier layer 3 is formed (step S2). Next, a thin-film transistor (TFT) layer 4, including terminals TM1, TM2 for external connection and terminal wiring lines TW1, TW2, is formed (step S3). Next, a top-emitting type light emitting element layer (for example, an organic light emitting diode (OLED) element layer) 5 is formed (step S4). Next, a sealing layer 6 is formed (step S5). Next, an upper face film is bonded to the sealing layer 6 (step S6). Next, a lower face of the resin layer 12 is irradiated with a laser light through the support substrate to reduce a bonding force between the support substrate and the resin layer 12, and the support substrate is peeled from the resin layer 12 (step S7). Next, a lower face film 10 is bonded to the lower face of the resin layer 12 (step S8). Next, a layered body including the lower face film 10, the resin layer 12, the barrier layer 3, the TFT layer 4, the light emitting element layer 5, and the sealing layer 6 is divided and a plurality of individual pieces are obtained (step S9). Next, a functional film 39 is bonded to the obtained individual pieces to form a display device 2 (step S10). Next, an electronic circuit board (for example, an integrated circuit (IC) chip) is mounted on the terminals TM1, TM2 (step S11). Note that each of the above-described steps is performed by a display device manufacturing apparatus described later.

Examples of the material of the resin layer 12 include polyimide, epoxy, and polyamide. Examples of the material used in the lower face film 10 include polyethylene terephthalate (PET).

The barrier layer 3 is a layer that inhibits moisture or impurities from reaching the TFT layer 4 or the light emitting element layer 5, and can be constituted by a silicon oxide film, a silicon nitride film, or a silicon oxynitride film, or by a layered film of these, formed by chemical vapor deposition (CVD).

The TFT layer 4 includes a semiconductor film 15, an inorganic insulating film 16 (a gate insulating film) in an upper layer overlying the semiconductor film 15, a gate electrode GE in an upper layer overlying the inorganic insulating film 16, an inorganic insulating film 18 in an upper layer overlying the gate electrode GE, a capacitance electrode CE in an upper layer overlying the inorganic insulating film 18, an inorganic insulating film 20 in an upper layer overlying the capacitance electrode CE, source wiring line SH in an upper layer overlying the inorganic insulating film 20, and a flattering film 21$p$ in an upper layer overlying the source wiring line SH. A thin layer transistor (TFT) Tr is constituted by the semiconductor film 15, the inorganic insulating film 16, and the gate electrode GE.

A non-active region (frame region) NA of the TFT layer 4 is provided with the terminals TM1, TM2 used for connection with an electronic circuit board, such as an IC chip and a flexible printed circuit (FPC), the terminal wiring line TW1 connected to the terminal TM1, and the terminal wiring line TW2 connected to the terminal TM2. The terminals TM1, TM2 are formed in the same layer as the source wiring line SH, the terminal wiring line TW1 is formed in the same layer as the gate electrode GE, and the terminal wiring line TW2 is formed in the same layer as the capacitance electrode CE.

The semiconductor film 15 is formed of, for example, low temperature polysilicon (LTPS) or an oxide semiconductor. Note that, in FIG. 2, the transistor Tr is illustrated that has a top gate structure in which the semiconductor film 15 is the channel, but the transistor Tr may have a bottom gate structure (when the TFT channel is the oxide semiconductor, for example).

The gate electrode GE, the capacitance electrode CE, the source wiring line SH, the terminal wiring lines TW1, TW2, and the terminals TM1, TM2 are each constituted by a single-layer metal film or a layered metal film including at least one of aluminum (Al), tungsten (W), molybdenum (Mo), tantalum (Ta), chromium (Cr), titanium (Ti), and copper (Cu), for example.

The inorganic insulating films 16, 18, 20 can be constituted by, for example, a silicon oxide (SiOx) film or a silicon nitride (SiNx) film, or a layered film of these, formed by CVD.

The flattering film (interlayer insulating film) 21$p$ can be constituted by, for example, a coatable photosensitive organic material, such as a polyimide, an acrylic, or the like.

The light emitting element layer 5 (an organic light emitting diode layer, for example) is provided with an anode 22 in an upper layer overlying the flattering film 21$p$, a bank 23 that covers an edge of the anode 22, an electroluminescence (EL) layer 24 in an upper layer overlying the anode 22, and a cathode 25 in an upper layer overlying the EL layer 24. A light emitting element (an organic light emitting diode (OLED), for example) including the anode 22 having an island shape, the EL layer 24, and the cathode 25, and a subpixel circuit for driving the light emitting element are provided on a per subpixel basis. The bank 23 (anode edge cover) can be formed of a coatable photosensitive organic material, such as a polyimide or an acrylic, for example.

For example, the EL layer 24 is formed by layering a hole injecting layer, a hole transport layer, a light emitting layer, an electron transport layer, and an electron injecting layer in this order, with the hole injecting layer being the bottom layer. While the light emitting layer is formed into an island shape on a per subpixel basis by vapor deposition or an ink-jet method, at least one layer of the hole injection layer, hole transport layer, electron transport layer, and electron injection layer may be a common layer having a solid-like shape, or may not be formed.

The anode (anode electrode) 22 is formed by layering Indium Tin Oxide (ITO) and an alloy containing Ag, for example, and has light reflectivity (described later in more detail). The cathode 25 can be constituted by a light-transmissive conductive material such as a MgAg alloy (extremely thin film) or ITO.

In the case where the light emitting element layer 5 is the OLED layer, positive holes and electrons are recombined inside the EL layer 24 by a drive current between the anode 22 and the cathode 25, and light is emitted as a result of excitons that are generated by the recombination falling into a ground state. Since the anode 22 is light-reflective and the cathode 25 is light-transmissive, the light emitted from the EL layer 24 travels upwards and results in top emission.

The light emitting element layer 5 is not limited to OLED element configurations, and may be an inorganic light emitting diode or a quantum dot light emitting diode.

The sealing layer 6 is light-transmissive, and includes an inorganic sealing film 26 that covers the cathode 25, an organic sealing film 27 in an upper layer overlying the inorganic sealing film 26, and an inorganic sealing film 28 that covers the organic sealing film 27. The sealing layer 6 covering the light emitting element layer 5 inhibits foreign matter, such as water and oxygen, from infiltrating to the light emitting element layer 5.

The inorganic sealing films 26, 28 may be made of a silicon oxide film, a silicon nitride film, a silicon oxynitride film, or a layered film of these, formed by CVD, for example. The organic sealing film 27 is a light-transmissive organic film thicker than the inorganic sealing films 26, 28 and can be constituted by a coatable organic material such as an acrylic.

After the support substrate has been peeled off, the lower face film 10 is bonded to the lower face of the resin layer 12 so as to achieve a display device having excellent flexibility. Examples of a material of the lower face film 10 include PET. The functional film 39 includes, for example, an optical compensation function, a touch sensor function, a protection function, or the like.

Above, the explanation is given for a case of manufacturing the flexible display device, but when a non-flexible display device is to be manufactured, since replacement of the substrate and the like is not required, the process may advance from step S5 to step S9 illustrated in FIG. 1, for example.

First Embodiment

Figure 4:
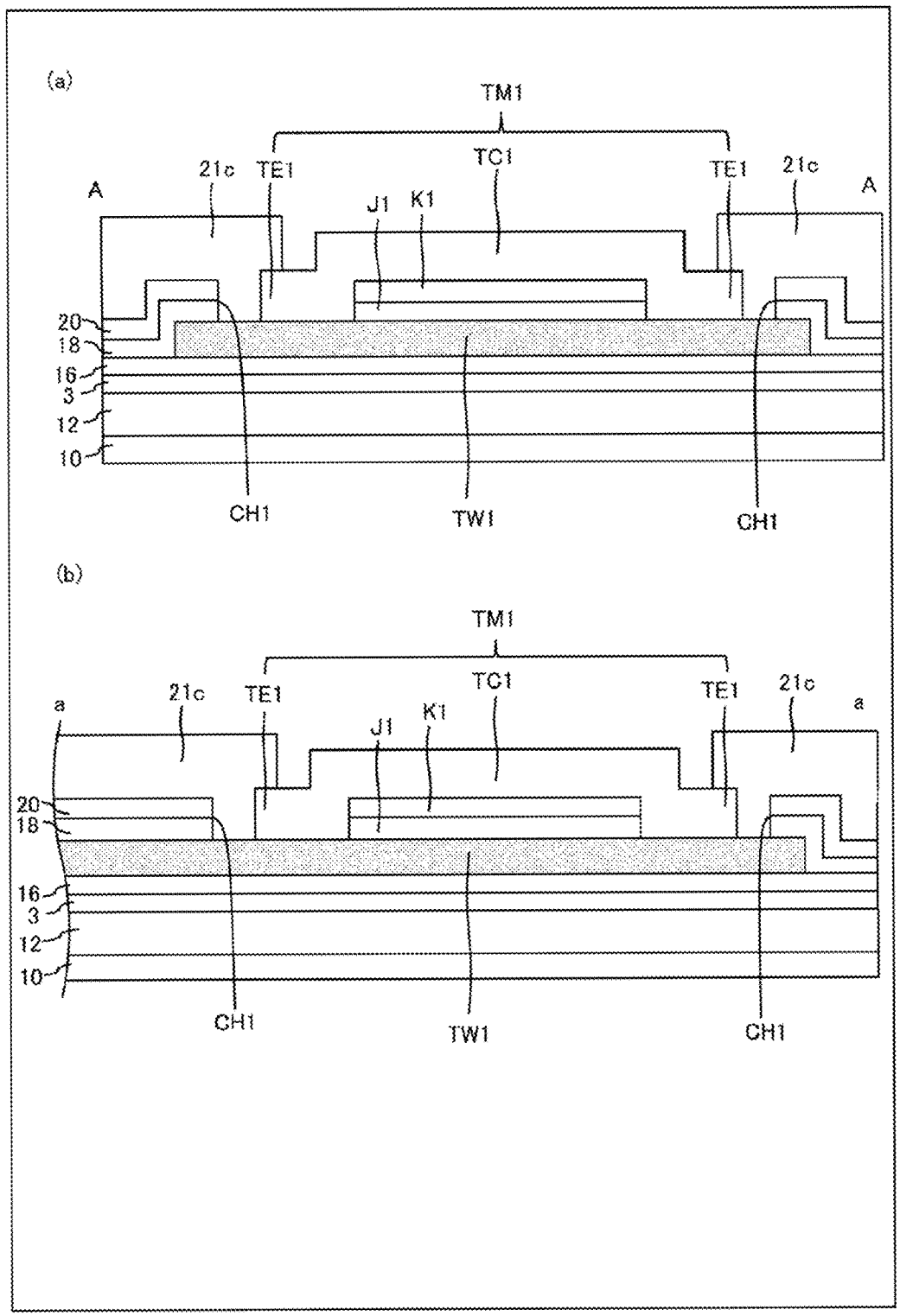
FIG. 4 is a cross-sectional view illustrating terminal cross sections (cross section A-A and cross section a-a in FIG. 3) of the first embodiment.
Figure 5:
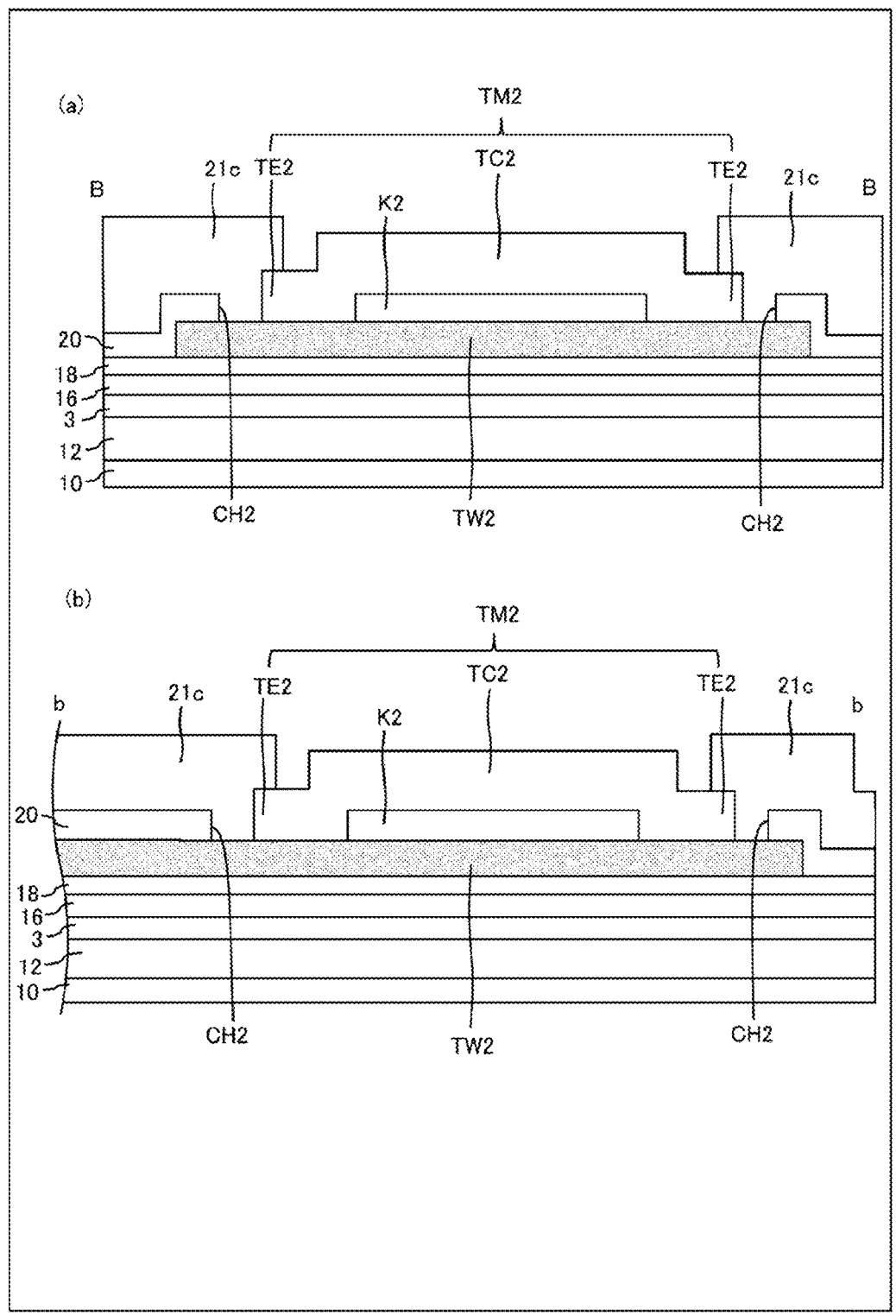
FIG. 5 is a cross-sectional view illustrating terminal cross sections (cross section B-B and cross section b-b in FIG. 3) of the first embodiment.
Figure 6:
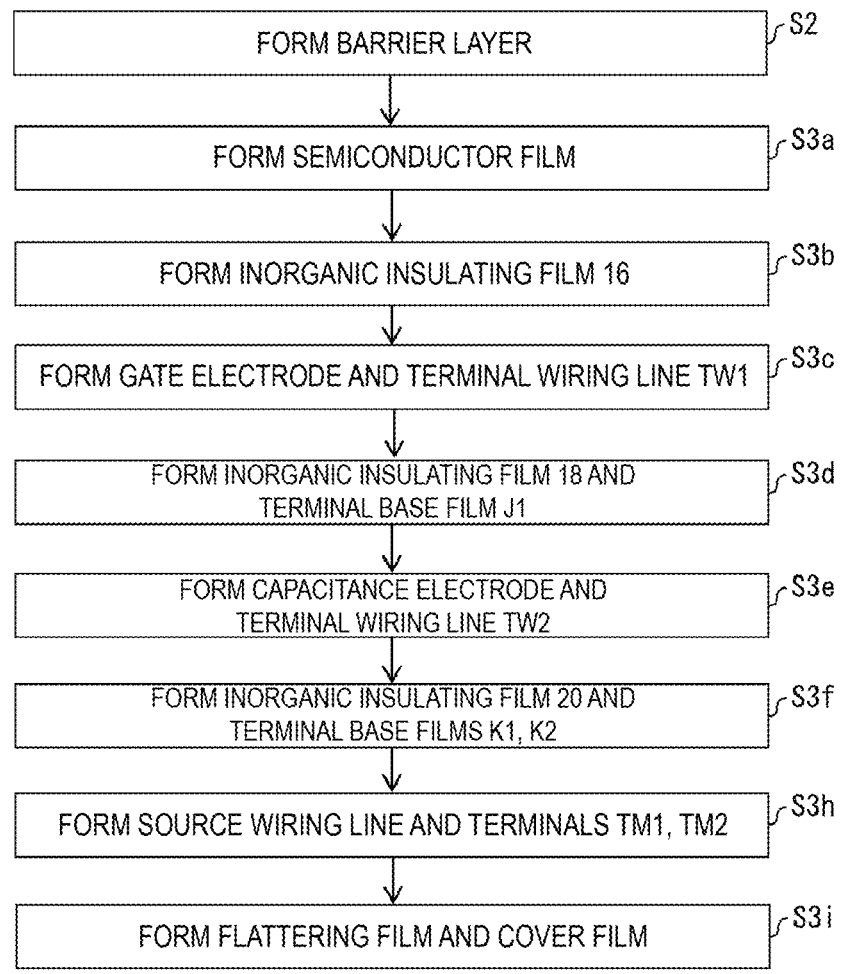
FIG. 6 is a flowchart illustrating a step of forming a TFT layer of the first embodiment.
Figure 7:
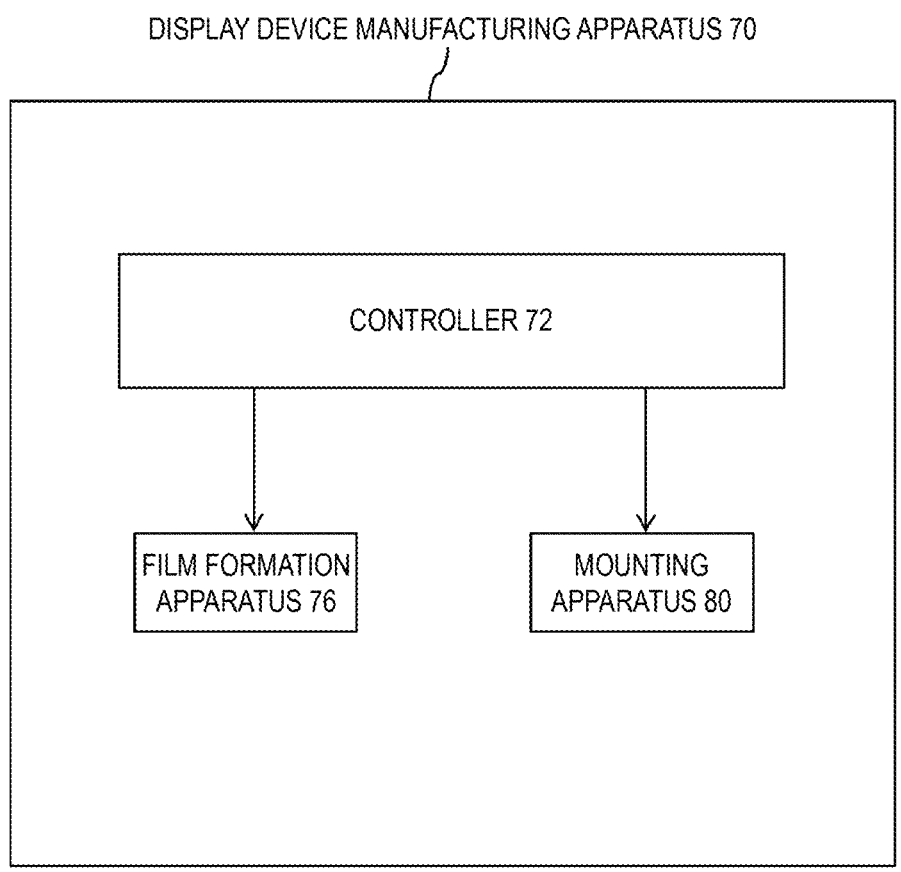
FIG. 7 is a block diagram illustrating a configuration of a display device manufacturing apparatus.

FIG. 4 is a cross-sectional view illustrating terminal cross sections (cross section A-A and cross section a-a in FIG. 3) of the first embodiment, FIG. 5 is a cross-sectional view illustrating terminal cross sections (cross section B-B and cross section b-b in FIG. 3) of the first embodiment, FIG. 6 is a flowchart illustrating a step of forming the TFT layer of the first embodiment, and FIG. 7 is a cross-sectional view illustrating a terminal cross section of a reference embodiment. As illustrated in FIG. 3 to FIG. 5, in the outer edge (non-display region) NA of the display device 2, the lower face film 10, the resin layer 12, the barrier layer 3, the inorganic insulating film 16 (first inorganic insulating film), the terminal wiring line TW1, the inorganic insulating film 18 (second inorganic insulating film), the terminal wiring line TW2, the inorganic insulating film 20 (third inorganic insulating film), the terminals TM1, TM2, and a cover film 21c are layered in that order from the lower layer side. The cover film 21c is an application-type organic insulating film made of a polyimide, an acrylic, or the like, and is formed in the same layer as the flattering film 21p (substrate of the light emitting element layer 5) illustrated in FIG. 2.

As illustrated in FIG. 4, the terminal TM1 includes a peripheral portion TE1, and a main portion TC1 on an inner side of the peripheral portion TE1, and the entire terminal TM1 overlaps with a tip portion of the terminal wiring line TW1 in a planar view (refer to FIG. 3). The main portion TC1 comes into contact with a peak portion (a portion higher than the peripheral portion by terminal base films J1, K1 described below) of the terminal TM1.

A moat-like contact hole CH1 overlapping with the peripheral portion TE1 of the terminal TM1 is formed in the inorganic insulating films 18, 20, and thus the terminal base film J1 having an island shape and in the same layer as the inorganic insulating film 18, and the terminal base film K1 having an island shape and in the same layer as the inorganic insulating film 20 are formed, and the main portion TC1 of the terminal TM1 and the terminal wiring line TW1 overlap via the terminal base films J1, K1 (both inorganic insulating films).

Further, a lower face of the peripheral portion TE1 and the terminal wiring line TW1 come into contact by the moat-like contact hole CH1, and the cover film 21c is formed covering the peripheral portion TEL The terminal TM1 is a low resistive wiring line in the same layer (of the same material) as the source wiring line SH in FIG. 2, and contains aluminum (Al), for example. Thus, the edge of the terminal TM1 is protected by the cover film 21c (organic insulating film) because the Al or the like would incur damage during the etching of the anode 22 (Ag alloy, for example) in a later step when exposed on the end face (side face) of the terminal wiring line.

As illustrated in FIG. 5, the terminal TM2 includes a peripheral portion TE2, and a main portion TC2 on an inner side of the peripheral portion TE2, and the entire terminal TM2 overlaps with a tip portion of the terminal wiring line TW2 in a planar view (refer to FIG. 3).

A moat-like contact hole CH2 overlapping with the peripheral portion TE2 of the terminal TM2 is formed in the inorganic insulating film 20, and thus a terminal base film K2 having an island shape and in the same layer as the inorganic insulating film 20 is formed, and the main portion TC2 of the terminal TM2 and the terminal wiring line TW2 overlap via the terminal base film K2 (inorganic insulating film).

Further, a lower face of the peripheral portion TE2 and the terminal wiring line TW2 come into contact by the moat-like contact hole CH2, and the cover film 21c is formed covering the peripheral portion TE2.

The covering of the peripheral portions TE1, TE2 of the terminals TM1, TM2 by the cover film 21c prevents the side faces (side faces of an aluminum film, for example) of the peripheral portions TE1, TE2 (layered films of an aluminum film sandwiched by two titanium films, for example) when the anode 22 (refer to FIG. 2) of the light emitting element layer 5 is patterned (step S4 in FIG. 1).

FIG. 6 is a flowchart illustrating a step of forming the TFT layer of the first embodiment. In step S2 following step S1 in FIG. 1, the barrier layer 3 is formed. In the next step S3a, the semiconductor film 15 (refer to FIG. 2) is formed. In the next step S3b, the inorganic insulating film 16 is formed. In the next step S3c, the gate electrode and the terminal wiring line TW1 are formed. In the next step S3d, the inorganic insulating film 18 and the terminal base film J1 are formed. In the next step S3e, the capacitance electrode CE (refer to FIG. 2) and the terminal wiring line TW2 are formed. In the next step S3f, the inorganic insulating film 20 and the terminal base films K1, K2 are formed. In the next step S3h, the source wiring line SH (refer to FIG. 2) and the terminals TM1, TM2 are formed. In the next step S3i, the flattering film 21p and the cover film 21c are formed. Note that formation (patterning) of the contact hole CH1 may be carried out by a continuous process.

FIG. 7 is a block diagram illustrating a configuration of a display device manufacturing apparatus. As illustrated in FIG. 7, a display device manufacturing apparatus 70 includes a film formation apparatus 76, a mounting apparatus 80, and a controller 72 that controls these apparatuses. The film formation apparatus 76 performs steps S3a to S3i in FIG. 6, and the mounting apparatus 80 performs step S11 in FIG. 1.

Figure 8:
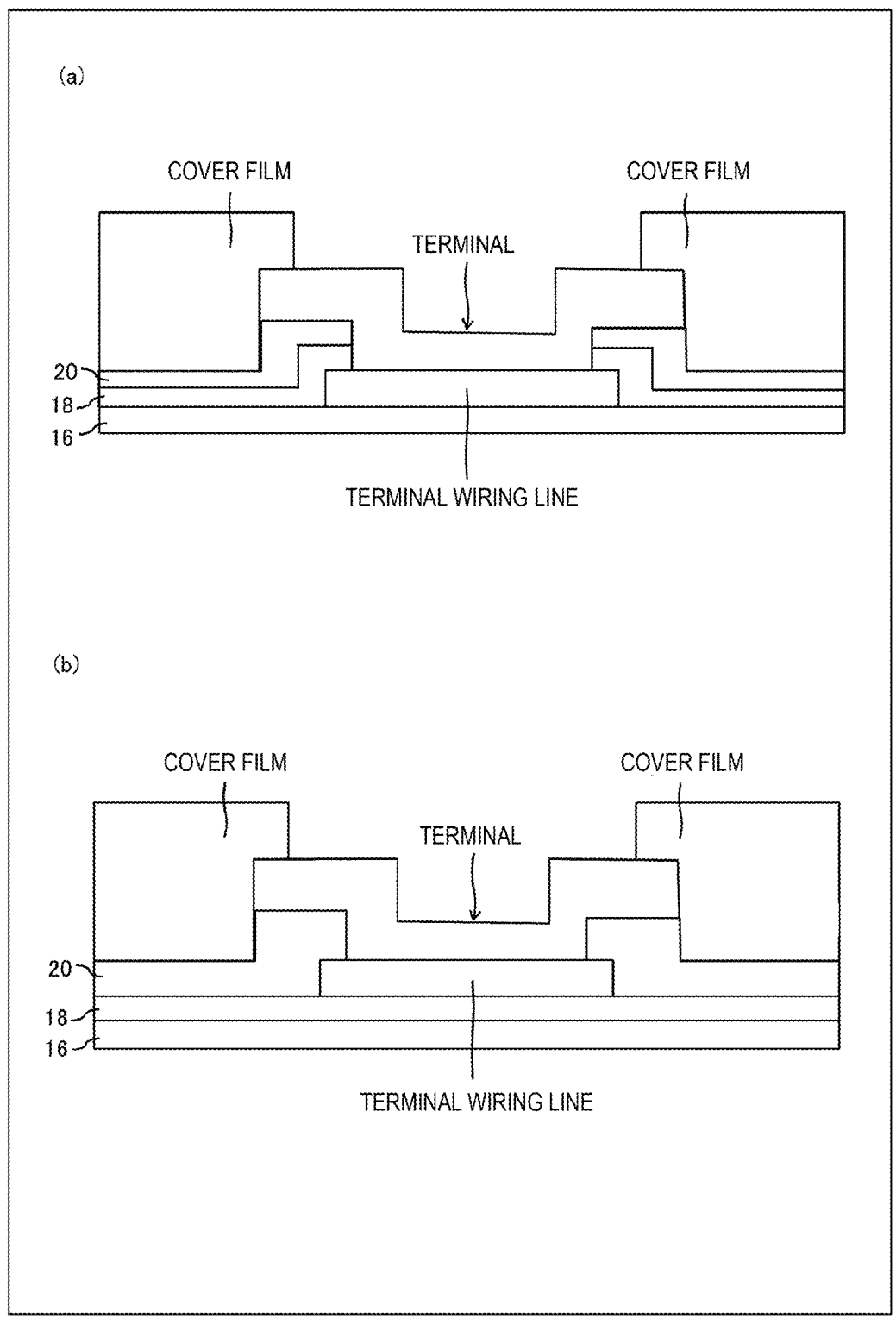
FIG. 8 is a cross-sectional view illustrating terminal cross sections of another embodiment.
Figure 9:
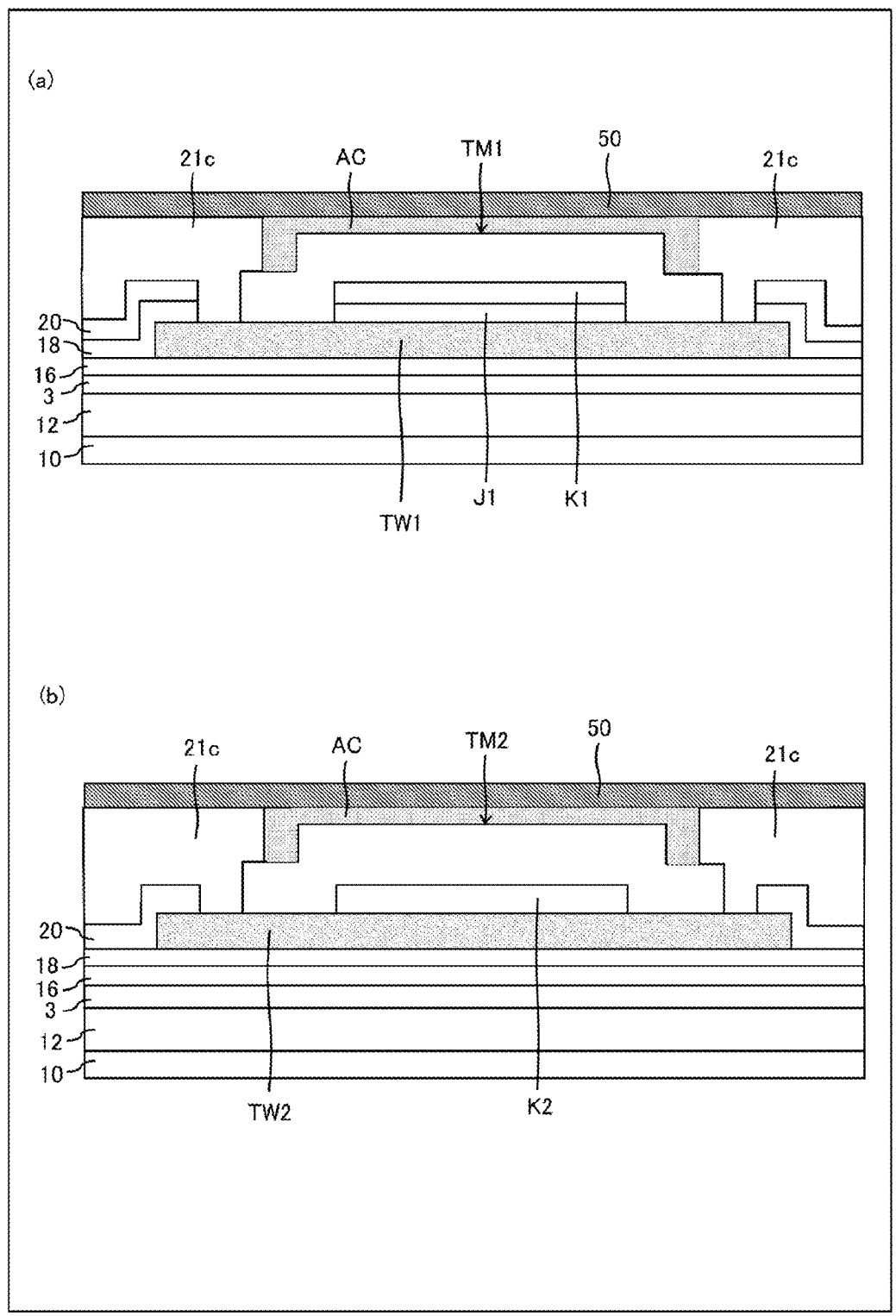
FIG. 9 is a cross-sectional view illustrating an external circuit substrate mounted on the display device.

According to the first embodiment, as illustrated in FIG. 4 and FIG. 5, the terminal base films J1, K1 are provided between the main portion TC1 and the terminal wiring line TW1, and the terminal base film K1 is provided between the main portion TC2 and the terminal wiring line TW2, and thus a step between the upper face of the cover film 21c covering the peripheral portions TE1, TE2 of the terminals TM1, TM2, and the upper faces (exposed faces) of the main portions TC1, TC2 is smaller than that in another embodiment in FIG. 8, for example. As a result, as illustrated in FIG. 9, when an external circuit substrate 50 (IC chip, for example) is mounted on the terminals TM1, TM2 via an anisotropic conductive material AC, poor connection between the external circuit substrate 50 and the terminals TM1, TM2 is less likely to occur.

Note that the terminal base film J1 is formed in the same process as the inorganic insulating film 18, and the terminal base films K1, K2 are formed in the same process as the inorganic insulating film 20, and thus there is no increase in the number of processes for forming the terminal base films.

Second Embodiment

Figure 10:
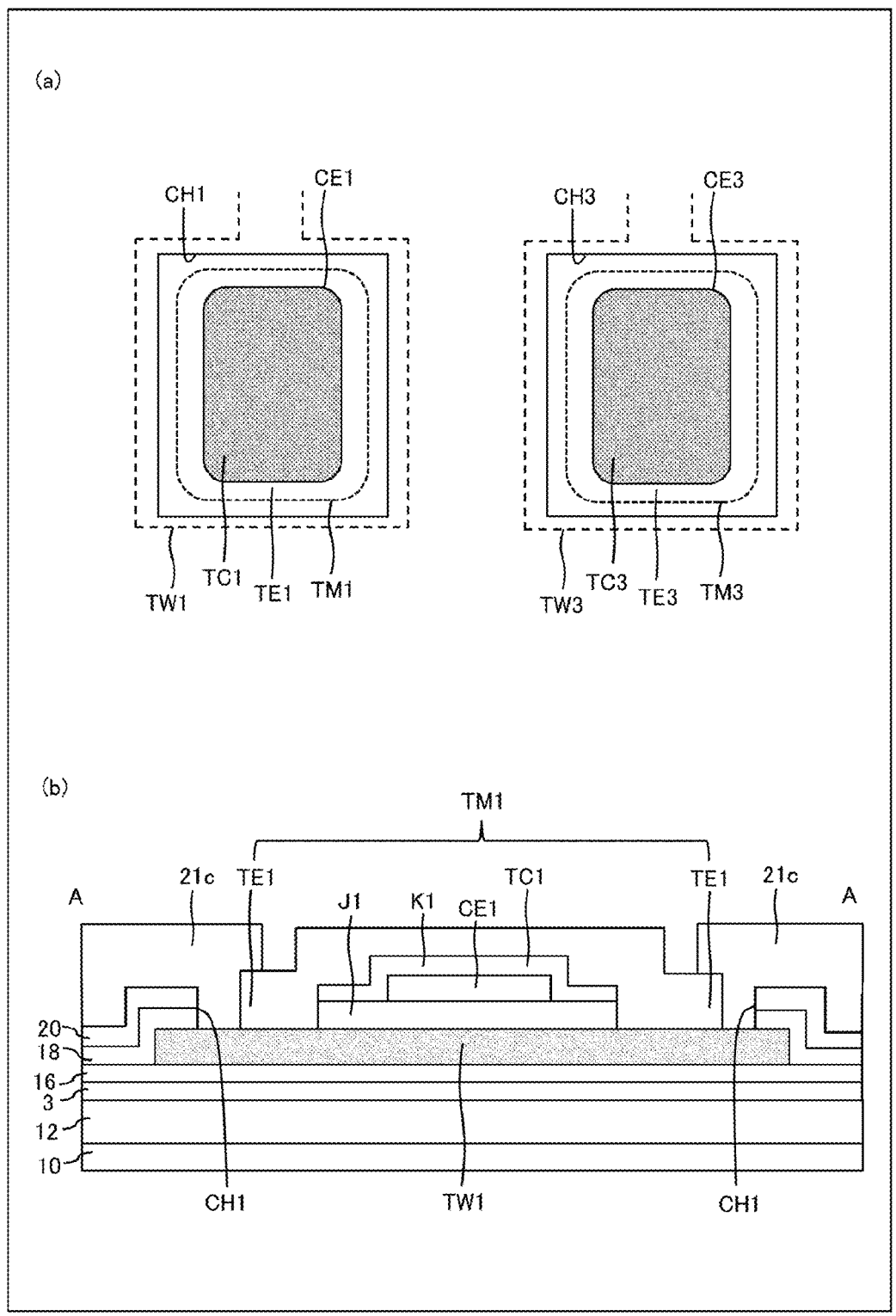
FIG. 10 illustrates a terminal configuration of a second embodiment. (a) of FIG. 10 is a plan view, and (b) of FIG. 10 is a cross-sectional view.

FIG. 10 illustrates a terminal configuration of a second embodiment. (a) of FIG. 10 is a plan view, and (b) of FIG. 10 is a cross-sectional view. As illustrated in FIG. 10, a conductive film CE1 of the same layer (formed in the same step) as the capacitance electrode CE in FIG. 2 may be arranged between the terminal base films J1, K1 (both inorganic insulating films). In other words, a top level (height of the peak of the terminal TM1) of the main portion TC1 of the terminal TM1 can be raised.

Figure 11:
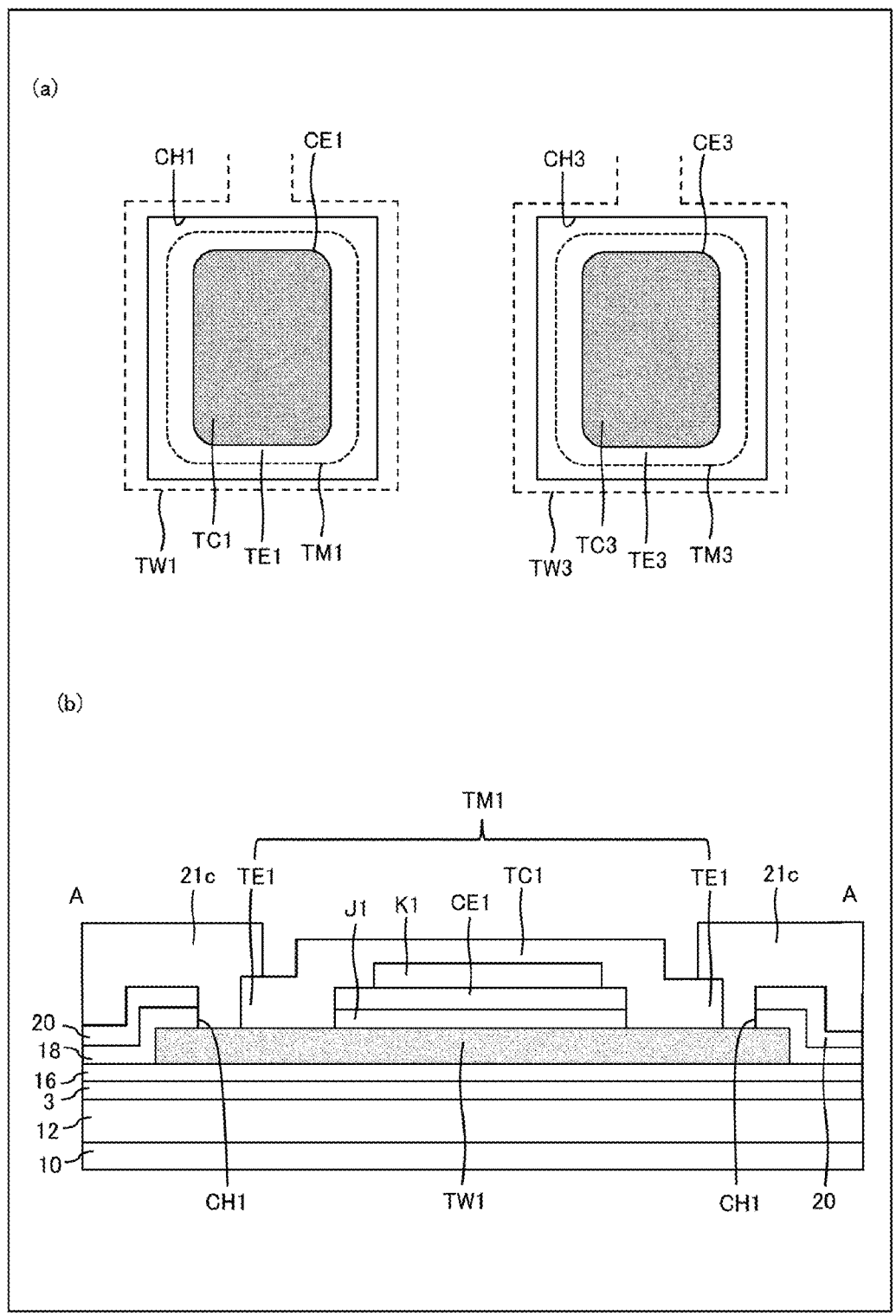
FIG. 11 illustrates a modified example of the second embodiment. (a) of FIG. 11 is a plan view, and (b) of FIG. 11 is a cross-sectional view.

FIG. 11 illustrates a modified example of the second embodiment. (a) of FIG. 11 is a plan view, and (b) of FIG. 11 is a cross-sectional view. In FIG. 11, the conductive film CE1 and the terminal base film J1 are aligned. In this configuration, in the process for patterning the inorganic insulating film 18 and forming the terminal base film J1, the conductive film CE1 can be made to function as a mask (etching stopper). That is, the shape of the terminal base film J1 is determined by the patterning of the conductive film CE1. Since the patterning of a conductive film (metal film) is more precise than the patterning of an inorganic insulating film, the configuration is excellent in terms of terminal integration (the gap between the conductive film CE1 and the inorganic insulating film 20 can be narrowed, increasing density). The terminal TM1 can be increased in size to the extent that the gap is narrowed.

Figure 12:
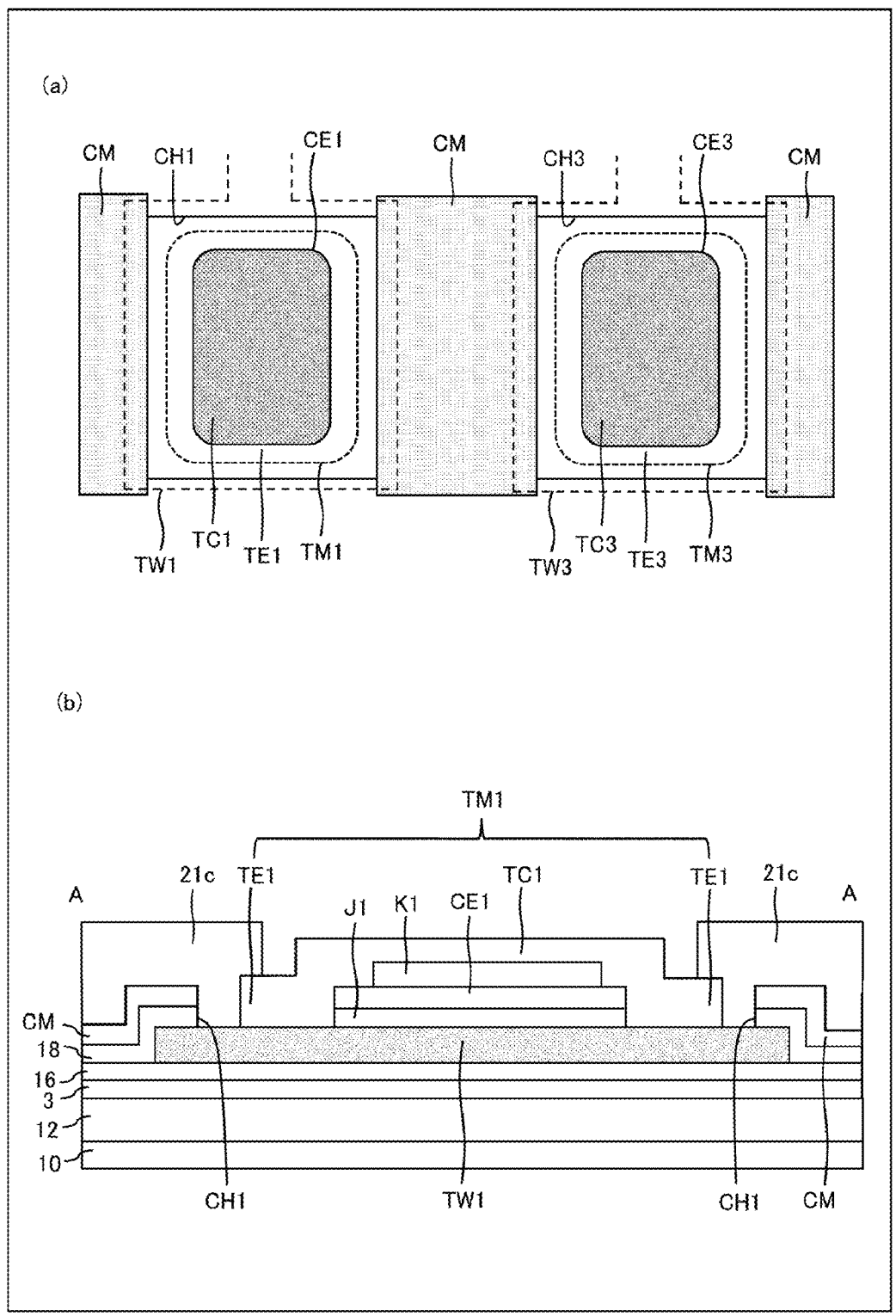
FIG. 12 illustrates another modified example of the second embodiment. (a) of FIG. 12 is a plan view, and (b) of FIG. 12 is a cross-sectional view.

FIG. 12 illustrates another modified example of the second embodiment. (a) of FIG. 12 is a plan view, and (b) of FIG. 12 is a cross-sectional view. In FIG. 12, an island-shaped metal film CM in the same layer as the conductive film CE1 is formed between the terminal TM1 and a terminal TM3 adjacent to the terminal TM1 in a first direction (horizontal direction in the drawings), the island-shaped metal film CM overlaps with the terminal wiring lines TW1, TW3 adjacent to each other via the inorganic insulating film 18, and an edge of the island-shaped metal film CM in a direction orthogonal to the first direction (vertical direction in the drawings) and an edge of the inorganic insulating film 18 are aligned. In FIG. 12, when the inorganic insulating film 18 is patterned, the conductive film CE1 and the island-shaped metal film CM function as masks, and thus an inner periphery (shape of the terminal base film J1) of the opening CH1 of the inorganic insulating film 18 and an outer periphery of the opening CH1 can be determined by the patterning of the conductive film CE1 and the island-shaped metal film CM. As a result, the terminals can be densely arranged.

Third Embodiment

Figure 13:
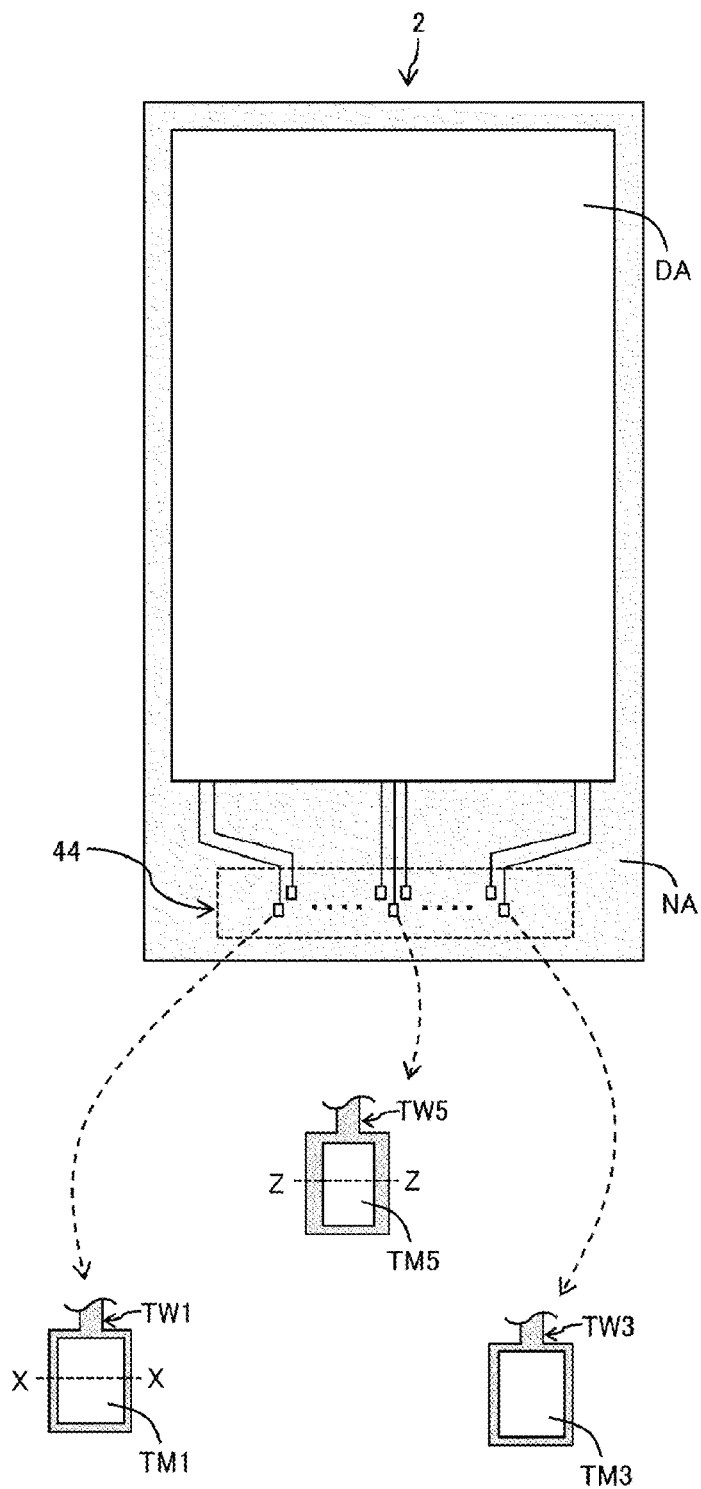
FIG. 13 is a plan view illustrating a terminal arrangement of a third embodiment.
Figure 14:
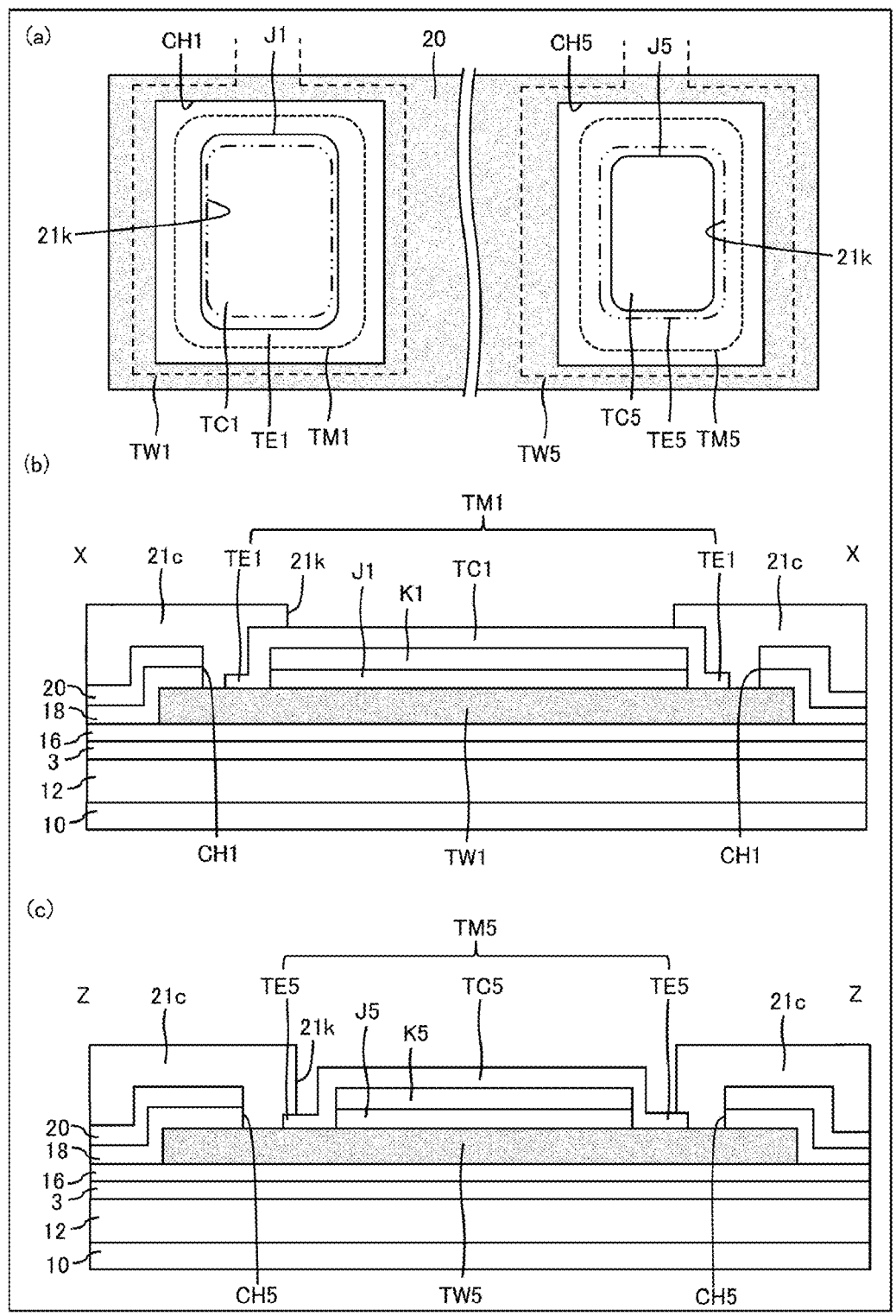
FIG. 14 illustrates a terminal configuration of the third embodiment. (a) of FIG. 14 is a plan view, and (b) and (c) of FIG. 14 are cross-sectional view.

FIG. 13 is a plan view illustrating the terminal arrangement of a third embodiment, (a) of FIG. 14 is a (transparent) plan view of FIG. 13, and (b) and (c) of FIG. 14 are cross-sectional views of FIG. 13. In the case of a flexible substrate, deflection and distortion occur unlike with a glass substrate, making alignment of the external circuit substrate and the terminals (particularly the terminal close to the side of the terminal portion) difficult. Here, with regard to the terminals TM1, TM3 positioned on an end portion of a terminal portion 44 in the longitudinal direction, the main portion TC1 of the terminal TM1 and a main portion TC3 of the terminal TM3 may be extended to the point of overlapping with the cover film 21c, as illustrated in (b) of FIG. 14. Thus, a hot spot (overlapped portion of the anisotropic conductive material and the main portions TC1, TC3) is widened, making it easy to mount the external circuit substrate, even with a flexible substrate. Note that, taking into consideration terminal integration as well, a terminal TM5 in a center portion of the terminal portion 44 may be configured so that a peripheral portion TES overlaps with the cover film 21c without a main portion TC5 of the terminal TM5 overlapping with the cover film 21c (the peripheral portion TES is exposed between the main portion TC5 and cover film 21c), as illustrated in (c) of FIG. 14. In FIG. 14, a width of the terminal TM5 positioned in the center portion is smaller than a width of the terminal TM1 positioned in the end portion in the longitudinal direction. That is, the center portion has a greater terminal density. Then, while the end portion in the longitudinal direction has a smaller terminal density, the width of the terminal is wide and the main portion is large. With such a configuration, it is possible to increase the terminal density and prevent poor contact at the end portion of the terminal portion in the longitudinal direction. Note that other terminals positioned between the terminal TM1 and the terminal T5, and other terminals positioned between the terminal TM5 and the terminal T3 may be imparted with the configuration in (b) of FIG. 14 or with the configuration in (c) of FIG. 14.

Figure 15:
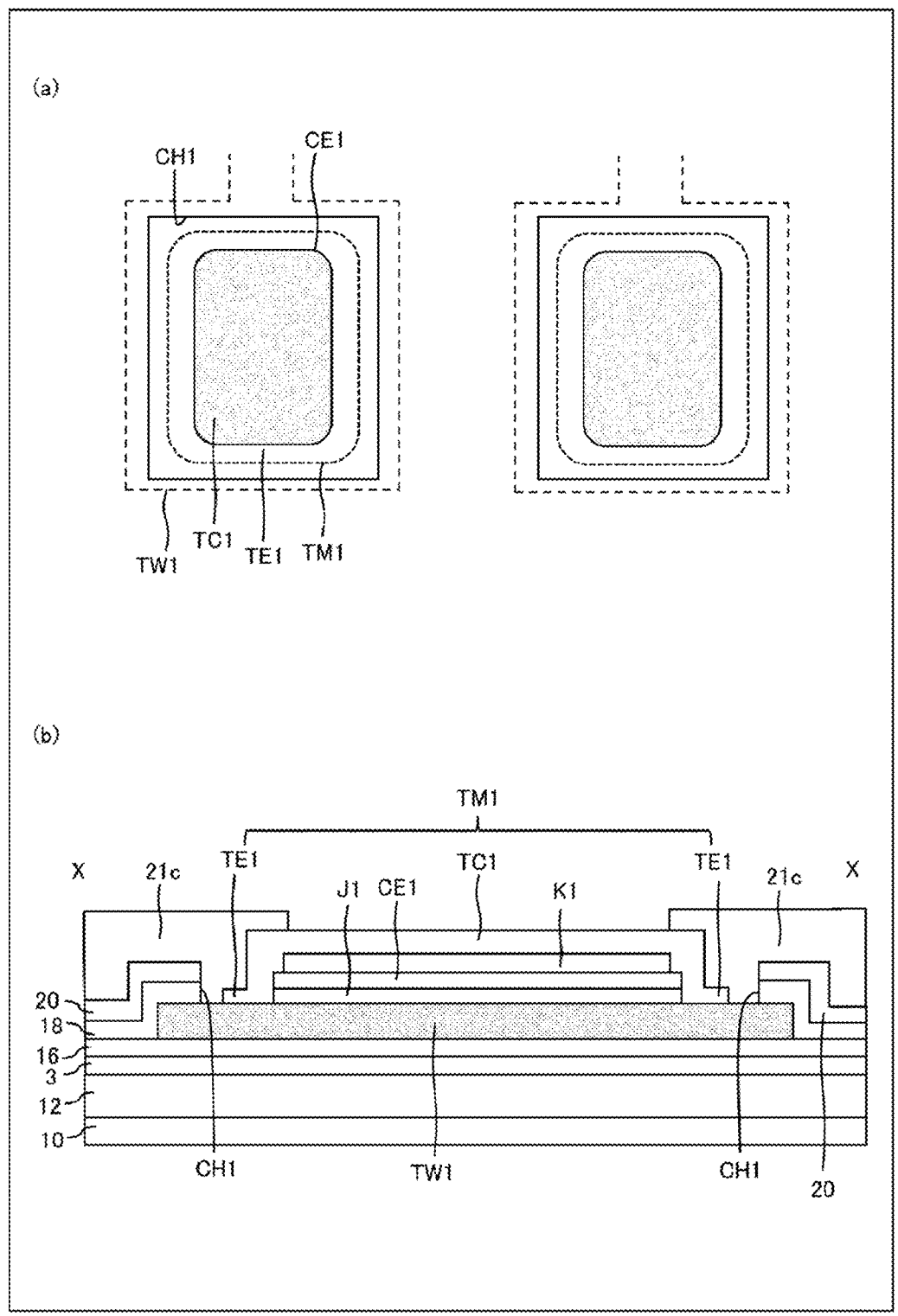
FIG. 15 illustrates a modified example of the third embodiment. (a) of FIG. 15 is a plan view, and (b) of FIG. 15 is a cross-sectional view.

FIG. 15 illustrates a modified example of the third embodiment. (a) of FIG. 15 is a plan view, and (b) of FIG. 15 is a cross-sectional view. As illustrated in FIG. 15, the conductive film CE1 of the same layer as the capacitance electrode CE in FIG. 2 may be arranged between the terminal base films J1, K1 (both inorganic insulating films). In other words, the top level (height of the peak of the terminal TM1) of the main portion TC1 of the terminal TM1 can be raised. Further, the conductive film CE1 and the terminal base film J1 are aligned. In this configuration, in the process for forming the terminal base film J1, the conductive film CE1 can be made to function as a mask. Thus, while edges of the terminal base film J1 and the conductive film CE1 are uniform (aligned), an edge of the terminal base film K1 is formed on inner sides of the respective edges of the terminal base film J1 and the conductive film CE1.

Figure 16:
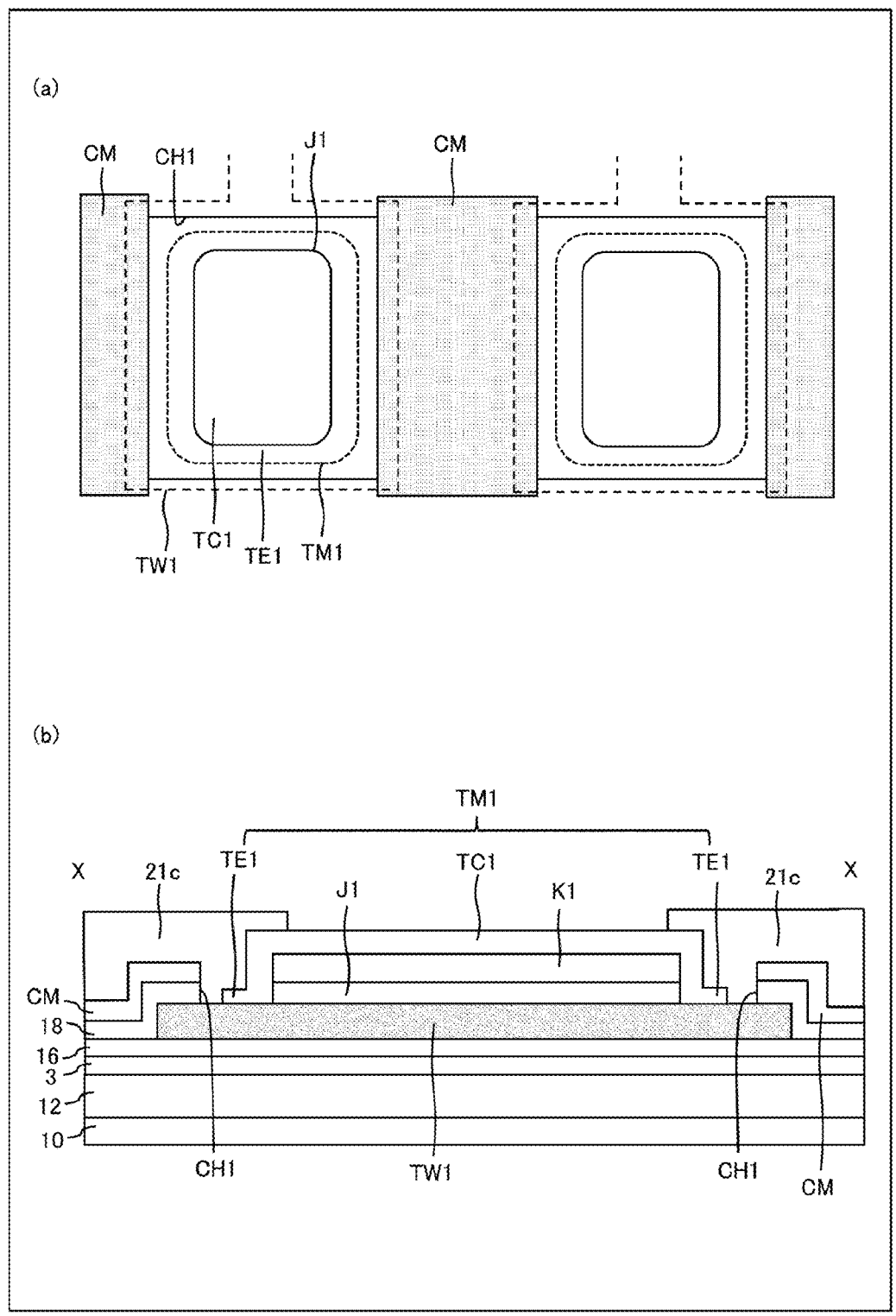
FIG. 16 illustrates another modified example of the third embodiment. (a) of FIG. 16 is a plan view, and (b) of FIG. 16 is a cross-sectional view.

FIG. 16 illustrates another modified example of the third embodiment. (a) of FIG. 16 is a plan view, and (b) of FIG. 16 is a cross-sectional view. In FIG. 16, the island-shaped metal film CM in the same layer as the capacitance electrode CE in FIG. 2 is formed between the terminal TM1 and the terminal TM3 adjacent to the terminal TM1 in the first direction (horizontal direction in the drawings) in the planar view, the island-shaped metal film CM overlaps with the terminal wiring line TW1 and the terminal wiring line adjacent thereto via the inorganic insulating film 18, and the edge of the island-shaped metal film CM in the direction orthogonal to the first direction (vertical direction in the drawings) and the edge of the inorganic insulating film 18 are aligned. In FIG. 16, when the inorganic insulating film 18 is patterned, the island-shaped metal film CM functions as a mask, and thus the outer periphery of the opening CH1 of the inorganic insulating film 18 can be determined by the patterning of the island-shaped metal film CM. As a result, the terminals can be densely arranged.

Figure 17:
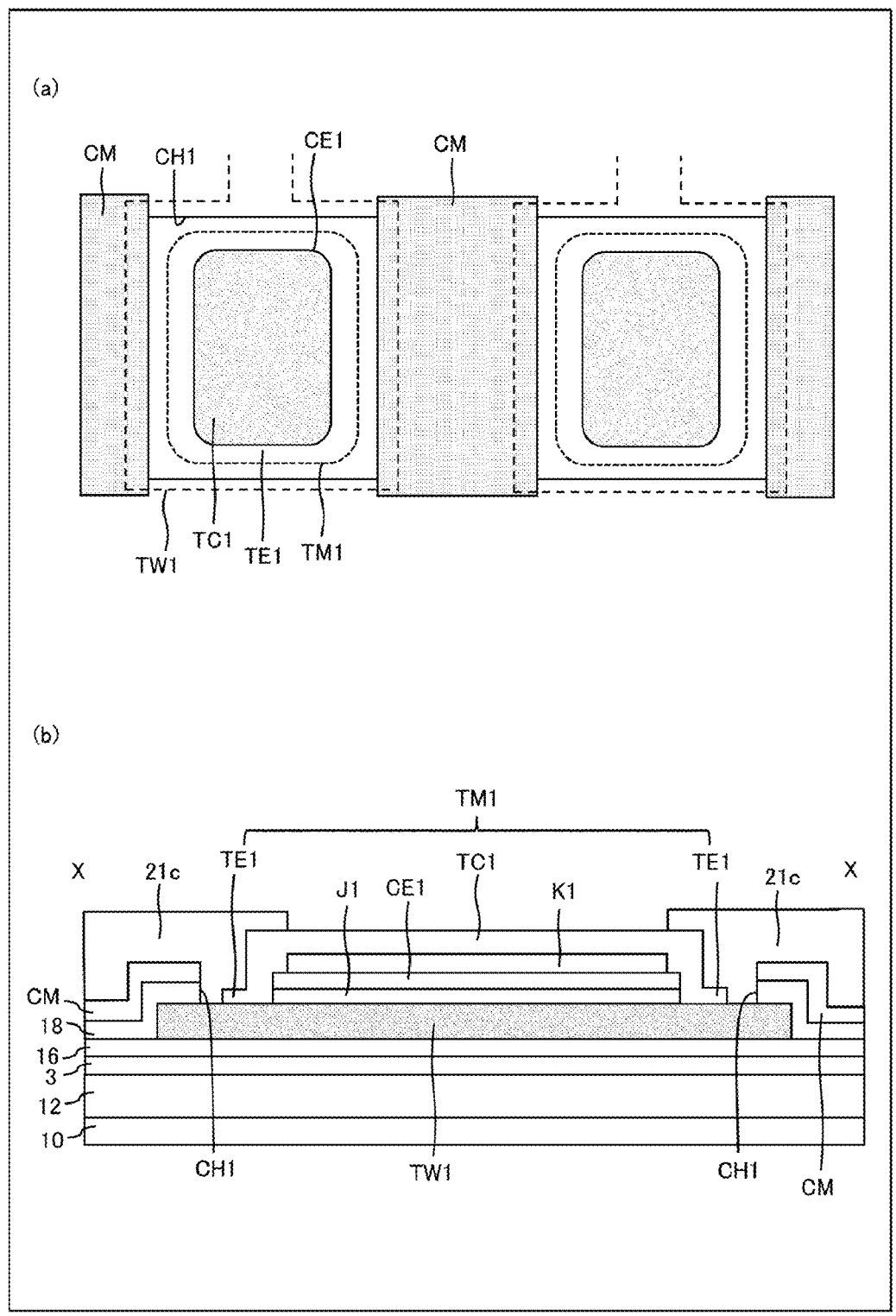
FIG. 17 illustrates yet another modified example of the third embodiment. (a) of FIG. 17 is a plan view, and (b) of FIG. 17 is a cross-sectional view.

FIG. 17 illustrates yet another modified example of the third embodiment. (a) of FIG. 17 is a plan view, and (b) of FIG. 17 is a cross-sectional view. In FIG. 17, the conductive film CE1 in the same layer as the capacitance electrode CE in FIG. 2 is arranged between the terminal base films J1, K1 (both inorganic insulating films), the island-shaped metal film CM in the same layer as the conductive film CE1 is formed between the terminal TM1 and the terminal adjacent to the terminal TM1 in the first direction (horizontal direction in the drawings) in a planar view, the island-shaped metal film CM overlaps with the terminal wiring line TW1 and the terminal wiring line adjacent thereto via the inorganic insulating film 18, and the edge of the island-shaped metal film CM in the direction orthogonal to the first direction (vertical direction in the drawings) and the edge of the inorganic insulating film 18 are aligned. Thus, while edges of the terminal base film J1 and the conductive film CE1 are uniform (aligned), an edge of the terminal base film K1 is formed on inner sides of the respective edges of the terminal base film J1 and the conductive film CE1.

In FIG. 17, when the inorganic insulating film 18 is patterned, the conductive film CE1 and the island-shaped metal film CM function as masks, and thus the inner periphery (shape of the terminal base film J1) of the opening CH1 of the inorganic insulating film 18 and the outer periphery of the opening CH1 can be determined by the patterning of the conductive film CE1 and the island-shaped metal film CM. As a result, the terminals can be densely arranged.

Fourth Embodiment

Figure 18:
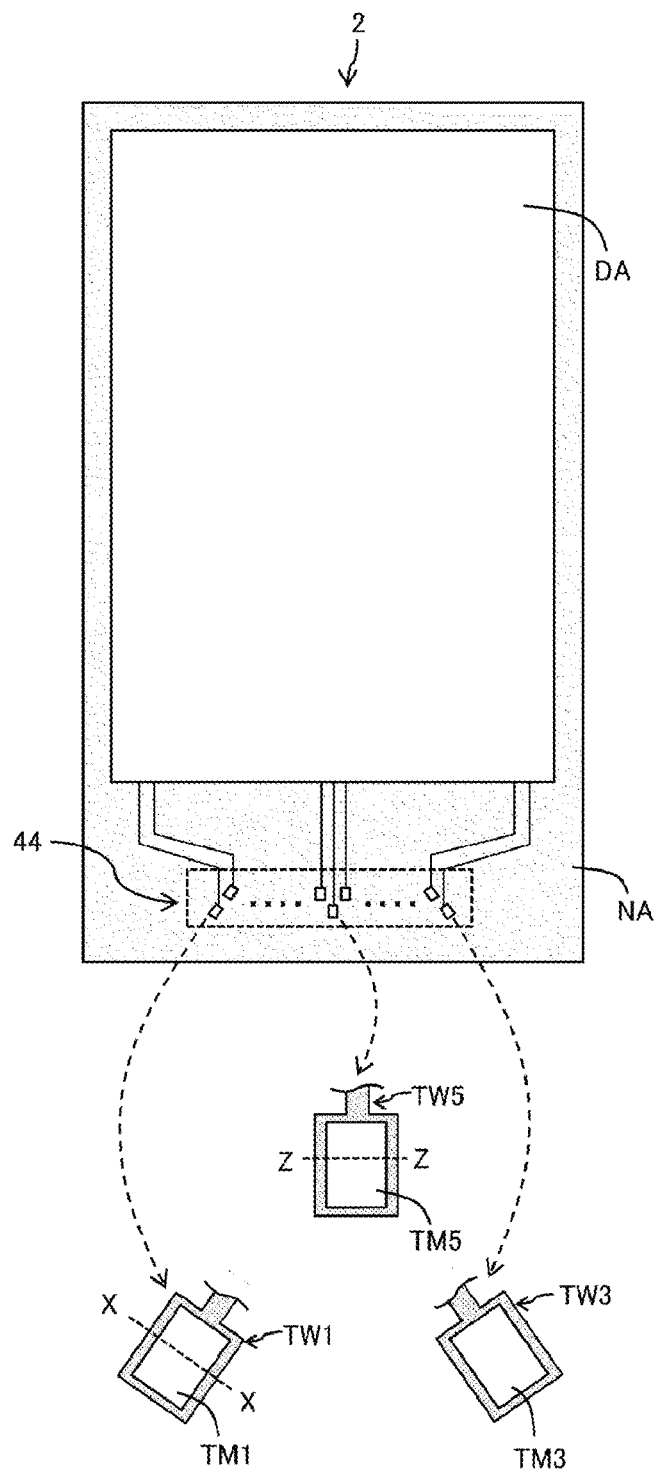
FIG. 18 is a plan view illustrating a terminal arrangement of a fourth embodiment.

FIG. 18 is a plan view illustrating a terminal arrangement of a fourth embodiment. As described above, in view of the difficulty in aligning the external circuit substrate and the terminals in the case of a flexible substrate (particularly on both sides of the terminal portion 44), for the terminals TM1, TM3 positioned on the end portions of the terminal portion 44 in a longitudinal direction, a display portion DA side (upper side in the drawing) may be inclined inward as illustrated in FIG. 18. Thus, the external circuit substrate is moved upward and downward (toward and away from the display portion DA) in FIG. 18 rather than leftward and rightward, increasing the probability of conduction between the external circuit substrate and the terminals.

The terminals TM1, TM3 in FIG. 13 can be imparted with the configuration in (a) of FIG. 14 or with the configuration in FIG. 15 to FIG. 17 so as to widen the hot spot. The structure in FIG. 18 can be combined with any of the terminal structures described above.

Supplement

An electro-optical element (an electro-optical element whose luminance and transmittance are controlled by an electric current) that is provided in the display device according to the present embodiment is not particularly limited. Examples of the display device according to the present embodiment include an organic electroluminescence (EL) display provided with the Organic Light Emitting Diode (OLED) as the electro-optical element, an inorganic EL display provided with an inorganic light emitting diode as the electro-optical element, and a Quantum dot Light Emitting Diode (QLED) display provided with a QLED as the electro-optical element.

The disclosure is not limited to the embodiments stated above. Embodiments obtained by appropriately combining technical approaches stated in each of the different embodiments also fall within the scope of the technology of the disclosure. Moreover, novel technical features may be formed by combining the technical approaches stated in each of the embodiments.

Aspect 1

A display device including:
a TFT layer provided with a terminal configured to receive a signal inputted from an external source, and a terminal wiring line in a lower layer underlying the terminal; and
a light emitting layer in an upper layer overlying the TFT layer,
wherein the terminal includes a main portion and a peripheral portion surrounding the main portion,
the peripheral portion is covered by a cover film,
the terminal wiring line and a lower face of the peripheral portion are in contact, and
the main portion and the terminal wiring line overlap via at least one terminal base film.

Aspect 2

The display device according to aspect 1, for example, wherein the terminal base film is an insulating film having an island shape.

Aspect 3

The display device according to aspect 1 or 2, for example, wherein the cover film is formed in a same layer as a flattering film serving as a substrate of a light emitting element including the light emitting layer.

Aspect 4

The display device according to any one of aspects 1 to 6, for example, wherein the main portion and the terminal wiring line overlap via a plurality of the terminal base films.

Aspect 5

The display device according to aspect 3, for example, wherein the TFT layer includes a gate wiring line, a first inorganic insulating film in a lower layer underlying the gate wiring line, a second inorganic insulating film in an upper layer overlying the gate wiring line, a capacitance wiring line in an upper layer overlying the second inorganic insulating film, a third inorganic insulating film in an upper layer overlying the capacitance wiring line, and a source wiring line in an upper layer overlying the third inorganic insulating film and in a lower layer underlying the flattering film, and
the terminal is formed in a same layer as the source wiring line.

Aspect 6

The display device according to aspect 5, for example, wherein the terminal base film is formed in a same layer as the second inorganic insulating film or the third inorganic insulating film.

Aspect 7

The display device according to aspect 5, for example, wherein the terminal wiring line is formed in a same layer as the gate wiring line or the capacitance wiring line.

Aspect 8

The display device according to aspect 5, for example, further including:
an island-shaped metal film formed in a same layer as the capacitance wiring line, between the terminal and a terminal adjacent to the terminal in a first direction, in a planar view,
wherein the terminal wiring line is formed in a same layer as the gate wiring line, and
the island-shaped metal film overlaps with the terminal wiring line, and an edge of the island-shaped metal film in a direction orthogonal to the first direction is aligned with an edge of the second inorganic insulating film.

Aspect 9

The display device according to aspect 5, for example, wherein an edge of the terminal wiring line surrounding the peripheral portion is covered by the second inorganic insulating film, in a planar view.

Aspect 10

The display device according to aspect 9, for example, wherein the main portion and the terminal wiring line overlap with each other via at least one of the terminal base films and a conductive film in a same layer as the capacitance wiring line.

Aspect 11

The display device according to aspect 10, for example, wherein the peripheral portion and the conductive film are in contact.

Aspect 12

The display device according to any one of aspects 1 to 11, for example,
wherein the terminal contains aluminum, and a lower electrode disposed in an upper layer overlying the terminal and in a lower layer underlying the light emitting layer contains at least one of aluminum, silver, and copper.

Aspect 13

The display device according to any one of aspects 1 to 12, for example,
wherein the main portion of the terminal and the cover film overlap.

Aspect 14

The display device according to any one of aspects 1 to 13, for example, further including:
a terminal portion including the terminal in a frame region surrounding a display region,
wherein the main portion and the cover film overlap in the terminal positioned on an end portion of the terminal portion in a longitudinal direction, and
the peripheral portion is exposed between the main portion and the cover film in the terminal positioned in a center portion of the terminal portion in the longitudinal direction.

Aspect 15

The display device according to any one of aspects 1 to 14, for example, further including:
a terminal portion including the terminal in a frame region surrounding a display region,
wherein the terminal positioned on an end portion of the terminal portion in a longitudinal direction includes a portion on a display region side that is inclined inward.

Aspect 16

A display device manufacturing method for a display device including a TFT layer provided with a terminal and a terminal wiring line in a lower layer underlying the terminal, and a light emitting element layer in an upper layer overlying the TFT layer, the terminal including a main portion and a peripheral portion surrounding the main portion, the manufacturing method comprising:
forming a terminal base film having an island shape on the terminal wiring line;
forming the terminal with the main portion and the terminal wiring line overlapping via the terminal base film, and with a lower face of the peripheral portion in contact with the terminal wiring line; and
covering the peripheral portion with a cover film.

Aspect 17

A display device manufacturing apparatus performing each of the steps described in aspect 16, for example.

REFERENCE SIGNS LIST

2 Display device
3 Barrier layer
4 TFT layer
5 Light emitting element layer
6 Sealing layer
12 Resin layer
16, 18, 20 Inorganic insulating film
21p Flattering film
21c Cover film
23 Bank (anode edge cover)
24 EL layer
44 Terminal portion
70 Display device manufacturing apparatus
TM1, TM2 Terminal
TW1, TW2 Terminal wiring line
TC1, TC2 Main portion (of terminal)
TE1, TE2 Peripheral portion (of terminal)
J1, K1, K2 Terminal base film (inorganic insulating film)
F1, F2 Terminal base film (organic insulating film)

The invention claimed is:

1. A display device comprising:
a TFT layer provided with a terminal configured to receive a signal inputted from an external source, and a terminal wiring line in a lower layer underlying the terminal; and
a light emitting layer in an upper layer overlying the TFT layer, wherein
the terminal includes a main portion and a peripheral portion surrounding the main portion,
the peripheral portion is covered by a cover film,
the terminal wiring line and a lower surface of the peripheral portion are in contact,
the main portion and the terminal wiring line overlap with each other via at least one terminal base film, and
the main portion and the peripheral portion are in a same layer.

2. The display device according to claim 1, wherein the terminal base film is an insulating film having an island shape.

3. The display device according to claim 1, wherein the cover film is formed in a same layer as a flattening film serving as a substrate of a light emitting element including the light emitting layer.

4. The display device according to claim 1, wherein the main portion and the terminal wiring line overlap via a plurality of the terminal base films.

5. The display device according to claim 3, wherein
the TFT layer includes a gate wiring line, a first inorganic insulating film in a lower layer underlying the gate wiring line, a second inorganic insulating film in an upper layer overlying the gate wiring line, a capacitance wiring line in an upper layer overlying the second inorganic insulating film, a third inorganic insulating film in an upper layer overlying the capacitance wiring line, and a source wiring line in an upper layer overlying the third inorganic insulating film and in a lower layer underlying the flattening film, and
the terminal is formed in a same layer as the source wiring line.

6. The display device according to claim 5,
wherein the terminal base film is formed in a same layer as the second inorganic insulating film or the third inorganic insulating film.

7. The display device according to claim 5,
wherein the terminal wiring line is formed in a same layer as the gate wiring line or the capacitance wiring line.

8. The display device according to claim 5, further comprising:
an island-shaped metal film formed in a same layer as the capacitance wiring line, between the terminal and a terminal adjacent to the terminal in a first direction, in a planar view,
wherein the terminal wiring line is formed in a same layer as the gate wiring line, and
an end portion of the island-shaped metal film overlaps an end portion of the terminal wiring line via the second inorganic insulating film, and
an edge of the island-shaped metal film in a direction orthogonal to the first direction is aligned with an edge of the second inorganic insulating film.

9. The display device according to claim 5, wherein an edge of the terminal wiring line surrounding the peripheral portion is covered by the second inorganic insulating film, in a planar view.

10. The display device according to claim 9, wherein the main portion and the terminal wiring line overlap with each other via at least one of the terminal base films and a conductive film in a same layer as the capacitance wiring line.

11. The display device according to claim 10, wherein the peripheral portion and the conductive film are in contact.

12. The display device according to claim 1, wherein the terminal contains aluminum, and a lower electrode disposed in an upper layer overlying the terminal and in a lower layer underlying the light emitting layer contains at least one of aluminum, silver, and copper.

13. The display device according to claim 1, wherein the main portion of the terminal and the cover film overlap.

14. The display device according to claim 1, further comprising:
 a terminal portion including the terminal in a frame region surrounding a display region, wherein
 the main portion and the cover film overlap in the terminal positioned on an end portion of the terminal portion in a longitudinal direction, and
 the peripheral portion is exposed between the main portion and the cover film in the terminal positioned in a center portion of the terminal portion in the longitudinal direction.

15. The display device according to claim 1, further comprising:
 a terminal portion including the terminal in a frame region surrounding a display region,
 wherein the terminal positioned on an end portion of the terminal portion in a longitudinal direction includes a portion on a display region side that is inclined inward.

16. A display device manufacturing method for a display device including a TFT layer including a terminal and a terminal wiring line in a lower layer underlying the terminal, and a light emitting element layer in an upper layer overlying the TFT layer, the terminal including a main portion and a peripheral portion surrounding the main portion, the manufacturing method comprising:
 forming a terminal base film having an island shape on the terminal wiring line;
 forming the main portion and the peripheral portion in a same layer in a same process such that the main portion and the terminal wiring line overlap via the terminal base film, and a lower surface of the peripheral portion is in contact with the terminal wiring line; and
 covering the peripheral portion with a cover film.

17. A display device manufacturing apparatus performing each of the steps described in claim 16.

* * * * *